(12) United States Patent
Mitzlaff et al.

(10) Patent No.: US 7,486,144 B2
(45) Date of Patent: Feb. 3, 2009

(54) RF POWER AMPLIFIER PROTECTION

(75) Inventors: James E. Mitzlaff, Arlington Heights, IL (US); Joseph F. Robin, Jr., Woodstock, IL (US)

(73) Assignee: Motorola, Inc., Schaumburg, IL (US)

( * ) Notice: Subject to any disclaimer, the term of this patent is extended or adjusted under 35 U.S.C. 154(b) by 90 days.

(21) Appl. No.: 11/683,069

(22) Filed: Mar. 7, 2007

(65) Prior Publication Data

US 2008/0218271 A1    Sep. 11, 2008

(51) Int. Cl.
    *H03F 1/52* (2006.01)
(52) U.S. Cl. .................................. 330/298; 330/310
(58) Field of Classification Search .................. 330/133, 330/207 P, 298, 310
    See application file for complete search history.

(56) References Cited

U.S. PATENT DOCUMENTS

| | | | |
|---|---|---|---|
| 5,426,395 A | 6/1995 | Cygan | |
| 6,580,318 B2 | 6/2003 | Taylor | |
| 6,850,119 B2 | 2/2005 | Arnott | |
| 7,268,990 B1 * | 9/2007 | Loeb et al. | 330/298 |
| 2007/0075782 A1 * | 4/2007 | Nakai | 330/298 |

* cited by examiner

*Primary Examiner*—Khanh V Nguyen
(74) *Attorney, Agent, or Firm*—Brian M. Mancini

(57) ABSTRACT

A circuit and method for protecting a radio frequency power amplifier against peak drain voltage. A detector circuit has an input connected to a drain of a power transistor of an amplification stage of the power amplifier to detect a peak drain voltage therefrom. The detector circuit outputs a protection signal when the detected peak drain voltage exceeds a predetermined reference level. A shutdown circuit is coupled to the detector circuit and inputs the protection signal therefrom. The protection signal is used to remove a gate bias of at least one amplification stage of the power amplifier. High frequency components are used in the detector and protection circuits to immediately reduce the drain voltage from one or more of the amplification stages.

20 Claims, 5 Drawing Sheets

RF POWER AMPLIFIER PROTECTION

FIELD OF THE INVENTION

The present invention relates generally to protection of power amplifiers and, in particular, to protection of power amplifiers from excessive operating power levels.

BACKGROUND OF THE INVENTION

Power amplifiers are used in transmitters to rebroadcast, at high power levels, amplitude modulation (AM) signals, frequency modulation (FM) signals, and quadrature amplitude modulation (QAM) signals. As is known, information is carried in the amplitudes of AM and QAM signals. Because of this, transmitters must accurately rebroadcast these signals, thus the power amplifiers within the transmitters must have high fidelity, i.e. linearly rebroadcast the signals they receive.

A typical linear transmitter includes a baseband signal generator that produces a baseband signal output in response to a digital input. The digital input is mapped to a constellation corresponding to output voltage level and phase. An example of such a modulation is QAM. The baseband signal is fed to an up mixer to create a radio frequency signal, which is then filtered and fed to a power amplifier for transmission over the air.

To maintain linear performance, the power elements (usually transistors) are operated at levels much below their rated output power levels. Thus, to achieve high output power levels, many power amplifiers include cascaded elements, such that the amplified output of one element is the input of the next element. In this manner, a small change in a first stage typically produces a large change in the final stage output. For this reason, the power amplifier utilizes a feedback control loop to maintain output power levels.

In some applications increased linearity was desired, and Cartesian feedback was found to significantly enhance linearity. Cartesian feedback comprises sampling the output of the power amplifier, down mixing it at the same frequency the up mixer uses (but with a phase shift which is pre-aligned to insure negative feedback), then feeding the down mixed signal back to a combiner or summing node and subtracting it from the output of the baseband signal generator. Instead of feeding the baseband signal directly to the up mixer, the difference of the baseband signal and the down mixed signal is amplified and fed to the up mixer. If the gain of the power amplifier goes up, the increase in gain is automatically compensated by the Cartesian feedback loop which reduces the level of the signal fed to the up mixer.

In practice, a power amplifier stage may use a power field effect transistor (FET) such as a lateral diffused metal-oxide-semiconductor (LDMOS) transistor. The gate of the transistor is coupled to an RF input waveform at a given fundamental frequency, which typically comprises an RF carrier modulated with information to be communicated over the air. The transistor then generates an amplified RF signal at its output, which creates a voltage response between the drain and source, which is a function of a drain current generated in the transistor and an impedance, which is based on an output matching network. Generally, the drain current comprises a spectral component at the fundamental frequency and spectral components at one or more harmonic frequencies. In a Class AB amplifier, these harmonic components are primarily even order components produced by the near cutoff DC gate bias, which only allows drain current to flow during the positive half cycles of the gate voltage waveform In one application, the transistor is operated near its maximum operating frequency. In this case, it is usually sufficient to design the matching network to correspond to or "dominate" only the fundamental component of drain current. Dominate herein means to specifically load a given spectral component of the output current of a power amplifier device with a desired impedance to create a corresponding desired spectral component of the voltage response at the output of the power amplifier device. In this application, the device output capacitance presents a low impedance to the harmonic components of the drain current, so that they do not substantially increase the drain voltage over that which is produced by the fundamental frequency drain current feeding into the fundamental frequency load impedance.

In another application, which is of primary interest in this invention, the transistor is operated at much less than its maximum operating frequency. In this situation, a high harmonic load impedance can be created when the RF power device output capacitance resonates with the residual inductance presented by the output impedance matching network at one or more of these harmonic frequencies. A high harmonic drain voltage component will be generated if there is a substantial drain current present at one of these "high impedance" harmonics. This is a particular problem at the even harmonics, where the Class AB bias tends to generate strong even harmonic currents, as noted above. These harmonic voltage components will add to the fundamental component of the drain voltage to produce a peak drain voltage which can exceed the device's drain-source breakdown voltage (BVds). When this happens, the high avalanche current produced by drain-source junction breakdown can destroy (burnout) the RF power device.

There are known techniques, such as those described in U.S. patent application Ser. No. 11/345,573 which can control critical harmonic impedances well enough to permit a moderate bandwidth VHF amplifier to operate without device failure if the input drive level is no more than 3 dB above the drive level required to produce nominal output power. This drive level limitation is common in constant envelope (FM) power amplifiers, where linearity is not required.

Linear power amplifiers, on the other hand, typically operate all stages, except the final stage, at levels that are 10 dB (or more) below their maximum output power capability. This is done to minimize the buildup of distortion in these "driver" stages. While this excess drive capability does not create problems in normal operation, it does mean that any stage, including the final stage, could see 10 dB or more overdrive in a "runaway" condition. Experience has shown that the techniques described in U.S. patent application Ser. No. 11/345,573 may be inadequate to prevent RF power device burnout in the event of such a severe overdrive.

One such "runaway" condition can arise if the feedback phase shift in a Cartesian feedback linearizer is set incorrectly, which can be caused by a hardware or software failure during the training process used to pre-align this phase shift. In this case, the Cartesian feedback linearizer can become a chaotic oscillator whose output power peaks will drive the PA driver chain to its maximum output power capability. In this case, burnout can occur when this overdrive causes the instantaneous drain voltage of an RF power transistor to exceed its breakdown voltage.

Currently, there exists no suitable method for the application designer to address this problem. In general, there are many forms of power amplifier protection circuits available, but none are known which can directly sense instantaneous drain voltage in a MOSFET power amplifier and can respond quickly enough to prevent burnout due to device breakdown.

One attempt at a solution is to use harmonic termination circuits to reduce peak drain voltage in a power amplifier stage at normal power levels. Although an improvement in the art, such solutions have demonstrated that harmonic termination circuits alone are not sufficient to prevent drain voltages from exceeding breakdown in extreme overdrive situations.

Another improvement in the art, U.S. Pat. No. 5,426,395, describes a circuit which protects a power amplifier from damage due to excessive operating power levels by increasing the level of negative feedback used in a feedback based power amplifier linearization system. This approach has two problems. First, it relies on sensing power amplifier output power after impedance matching, which does not directly correspond to peak drain voltage. Second, increasing feedback will actually increase power amplifier overdrive in cases where the feedback phase is positive due to a misaligned Cartesian feedback linearizer.

Yet another solution is U.S. Pat. No. 6,580,318, which is similar to U.S. Pat. No. 5,426,395, but uses a power control feedback loop to reduce power amplifier drive and/or gain when output power exceeds a preset threshold. In addition to the sensing problem in U.S. Pat. No. 5,426,395, this circuit has a slow response time due to the need limit power control feedback loop bandwidth in order to maintain loop stability.

Yet another solution is U.S. Pat. No. 6,850,119, which discloses a circuit to prevent HBT power amplifier damage by reducing power amplifier drive and/or RF device bias levels. However, this reference uses a different overload detection mechanism, i.e. sensing changes in the base bias of an HBT device. This will not work for MOSFET devices, whose gate bias will not change as a function of output or input power (or any other condition), until the device is actually destroyed. In addition, the disclosed protection circuit contains linear feedback, so its response time is constrained in the same manner as in U.S. Pat. No. 6,580,318. In addition, both U.S. Pat. Nos. 6,580,318 and 6,850,119 contain linear feedback loops, which must have limited bandwidth, and hence long response times, due to the need to maintain loop stability.

Therefore, a need exists for a method and apparatus that provides protection of power amplifiers from excessive operating power levels. It would also be an advantage to provide protection at a faster response than prior art protection circuits.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, wherein:

DETAILED DESCRIPTION OF THE PREFERRED EMBODIMENT

Generally, the present invention provides a method and apparatus which protects a power amplifier from destructive operating conditions which may arise as the result of severe overdrive of a transistor amplifier. The protection is accomplished by directly sensing the drain voltage, comparing the level to a predetermined reference, and, in the event the reference is exceeded, removing the gate bias applied to the amplifier elements. The present invention responds fast enough to prevent the transistor output voltage from ever reaching the breakdown voltage of the transistor. Once triggered, the transistor is kept off for a period of time sufficiently long enough to insure that the transmitter senses a problem and resets itself. A novel aspect of the invention having the detector connection directly at the transistor output lead, as opposed to the prior art which sense at the output of the amplifier stage or module, a point at which the voltage waveform is less rich in harmonic content due to filtering action of the output matching network and therefore exhibits lower peak voltage levels than those present at the transistor output lead. Although the invention as described herein is applied to a Cartesian feedback linearization transmitter, it should be recognized that the present invention is also applicable to Software Defined Radio transmitters that cover a wide band of frequencies using a single transmitter.

Figure 1:
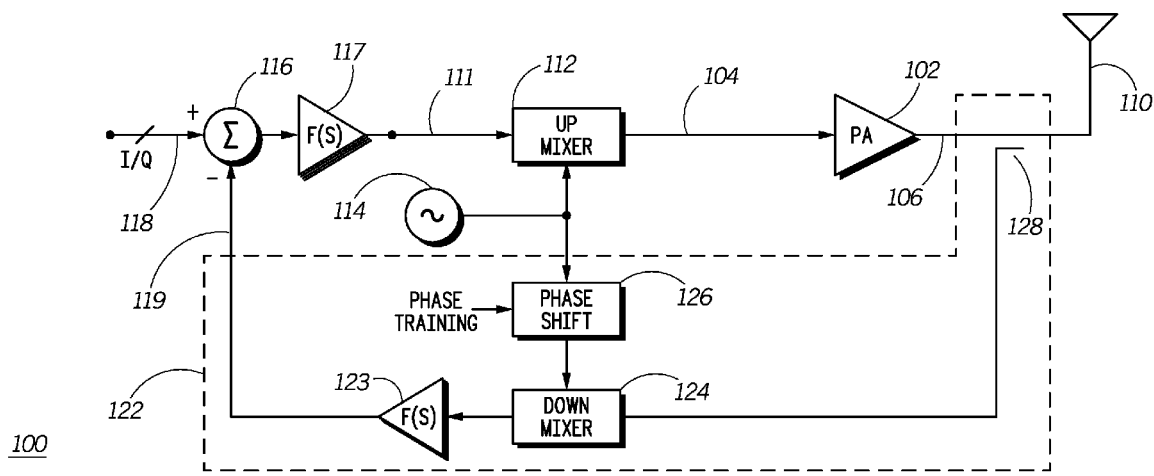
FIG. 1 illustrates a transmitter using Cartesian feedback linearization, in accordance with the present invention.

Referring now to FIG. 1, there is shown a block diagram schematic 100 of a linear transmitter using Cartesian feedback. The transmitter is centered around a radio frequency (RF) power amplifier (PA) 102 that has an input 104 and an output 106. The PA amplifies a RF signal fed to the input 104 by a gain factor to provide an amplified RF signal at the output 106, which is coupled to an antenna 110. The gain of the PA is adjustable. The RF signal fed to the input of the PA is generated by an up mixer 112, which requires no filtering if the up mixer is a low noise mixer. However, filtering can be used, as well, to avoid overdriving the up mixer, or maintaining a particular loop gain for stability reasons, or both. The up mixer mixes a baseband signal fed to the input 111 of the up mixer with an RF carrier signal generated by a local oscillator 114 to produce the modulated RF signal fed to the PA. This input signal is referred to as the amplified error signal. Since the transmitter uses Cartesian feedback, the signal fed to the up mixer is derived from a combiner 116. The combiner 116 has first and second inputs 118, 119, respectively. The signals received at these inputs are combined in a way such that the effect is subtracting the second input from the first input. There are numerous ways this can be accomplished, such as directly subtracting one signal form the other, or placing an inverter in the path of one of the signals and summing them. The signal applied to the first input is the baseband signal that includes I & Q components. The signal applied to the second input of the combiner 116 is generated by a Cartesian feedback path 122. The output of the combiner is an error signal. Because the error signal will be a low level signal, it is amplified by a feedforward baseband amplifier 117 which amplifies the error signal and feeds the amplified error signal 111 to the up mixer 112. The feedforward baseband amplifier is designed to have a particular transfer function to set the loop bandwidth. Therefore, it can be seen that the amplified error signal 111 is related to the difference of the baseband signal 116 and the Cartesian feedback signal 119 produced by the Cartesian feedback path. Because of the transfer function of the feedforward baseband amplifier, the amplified error signal is not necessarily proportional to the error signal. The Cartesian feedback path comprises a feedback baseband amplifier 123, and a down mixer 124 which samples the output of the power amplifier through a coupler 128 and mixes it with the carrier signal generated by the local oscillator 114 and shifted by phase delay element 126. Similar to the feedforward baseband amplifier 117, the feedback baseband amplifier 123 may be designed with selected poles and zeroes to set the loop bandwidth.

The gain of the transmitter can experience active and passive changes (e.g. temperature changes, etc.). Any change in gain is reflected in the ratio of the amplified error signal and baseband signal as follows: the output power of the power amplifier would tend to change, but the Cartesian feedback path effectively adjusts the amplified error signal 111 to counteract the gain increase so that even though the amplifier gain may change, the output power of the signal is what it would be had the amplifier gain not increased.

Moreover, the transmitter may experience instabilities due to glitches in the training or control of the phase shift element 126. For example, the feedback loop will become unstable if phase shift departs from ideal value by 90° or more. In order to maintain good base (uncorrected) linearity in normal operation, the IQ up mixer 112 (and subsequent driver stages) must be operated at least 10 dB below peak output capability. An unstable loop will drive the IQ up mixer to full peak output, thus overdriving the PA 102 by 10 dB or more.

The present invention addresses these issues by providing a protection circuit that directly measures the peak drain voltage of any RF power device in the transmitter that can have a high impedance, even-ordered harmonic termination at some operating frequency. When an impending overvoltage condition is detected, the PA drive and/or PA gain is rapidly reduced, thus preventing the occurrence of a voltage peak which exceeds the device breakdown voltage.

Figure 2:
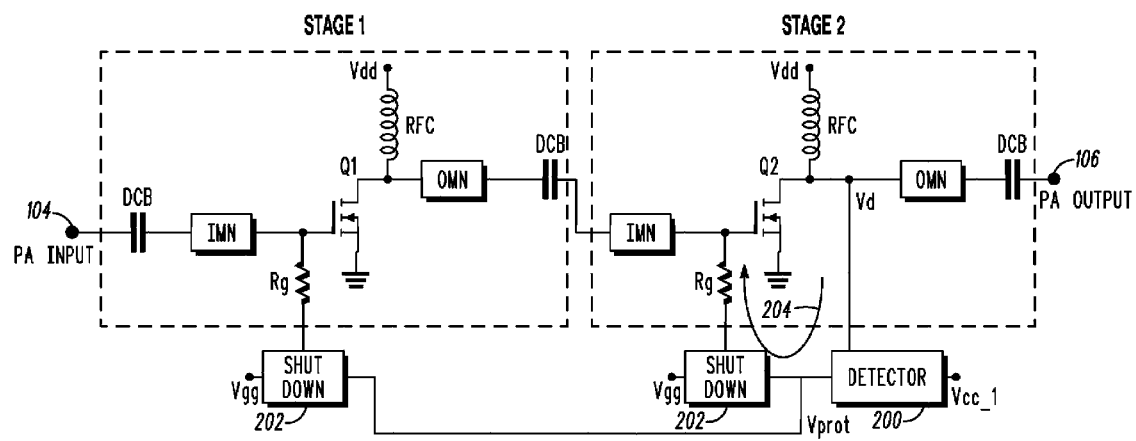
FIG. 2 illustrates a power amplifier, in accordance with the present invention.

FIG. 2 illustrates how this protection circuit could be applied to a typical two-stage PA 102. The input to the detector circuit 200 is connected directly to the drain of the RF power device having the highest peak drain voltage (FET Q2). This is typically the last stage in a PA lineup, but could be an intermediate stage in some cases. Note that the detector input is not connected to the PA output, as described in the prior art. This is because the output impedance matching network (OMN) typically removes most of the harmonics from the drain voltage (Vd) waveform, so that PA output voltage does not provide a reliable indication of the peak drain voltage.

The detector output (Vprot) is connected to the inputs of one or more shutdown circuits 202 (two are used in this example). The output of each shutdown circuit 202 is used to provide gate bias to its respective PA stage through an isolation resistor (Rg), so long as Vprot remains low. When the monitored drain voltage (Vd) exceeds the maximum safe level, the detector circuit 200 drives Vprot high, which causes the shutdown circuits 202 to rapidly force their gate bias outputs to zero, effectively immediately reducing to a very low level the output of the stage having the gate bias removed.

The remaining blocks in FIG. 2 have the following standard functions. The input matching network (IMN) transforms the interface impedance (typically 50 ohms) to the impedance which provides maximum RF power into the gate terminal of each device (Q1, Q2). DC blocking capacitors (DCB) prevent unwanted coupling of DC voltages between stages, and to the circuits connected to the PA Input and PA Output terminals 104, 106. RF Chokes (RFC) isolate the main DC supply (Vdd) from the RF voltages present at the drain terminals of Q1 and Q2.

Advantageously, the present invention allows the shut down of several PA stages, and can have multiple detection points. This gives this protection circuit the ability to handle the extreme overdrive peaks produced by an oscillating Cartesian feedback linearizer. In addition, the present invention directly detects Vd peaks, as opposed to prior art protection circuits that typically detect output power, or some unusual parameter like base bias current, that has no direct relation to peak Vd.

Figure 3:
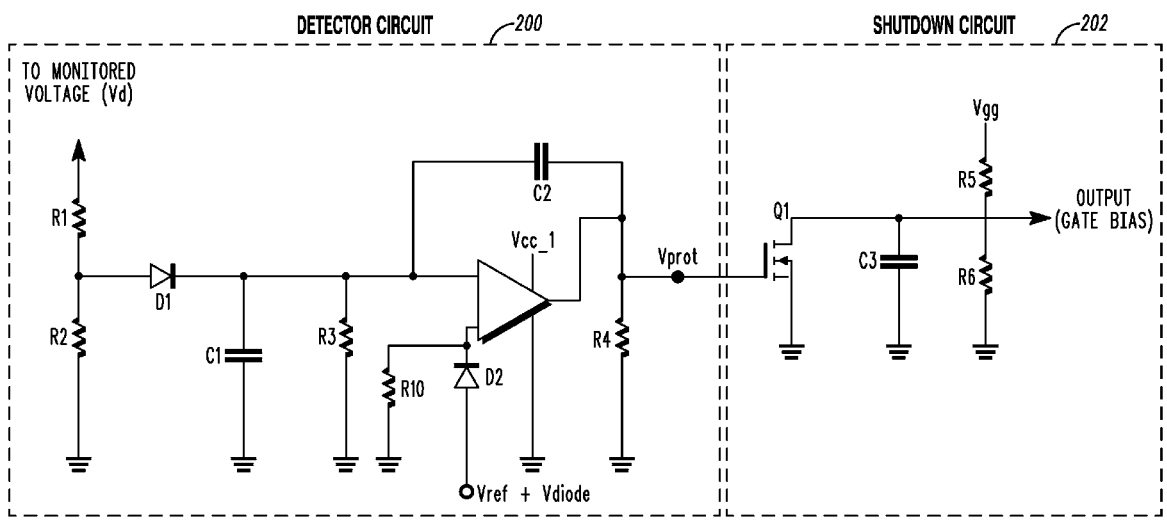
FIG. 3 illustrates a detector and shutdown circuit, in accordance with the present invention.

FIG. 3 represents a preferred embodiment of the protection circuit of the present invention, including a detector circuit 200 and a shutdown circuit 202. These circuits can be used to protect a high power VHF base station PA from overvoltage damage to the final device. This protection circuit is split into two parts. The detector circuit 200 is used to determine when the peak drain voltage (Vd) exceeds a maximum safe level, at which point its output, Vprot, goes from a low to a high level. The shutdown circuit 202 is used to rapidly remove the gate bias from one or more stages in a PA lineup when Vprot goes high. As such, there may be multiple shutdown circuits connected to a single detector circuit, although only one shutdown circuit is shown here. Additionally in some cases it may be desirable to have multiple detector circuits, any or all of which could be diode connected as desired to control the shutdown circuit.

Removing gate bias from a PA stage has the same effect as reducing the drive level to that stage, which, in turn, reduces the peak drain voltage. In cases of severe overdrive, it may be necessary to also remove gate bias from PA stages preceding the stage to be protected, in order to reduce effective drive to that "final" stage to a safe level.

R1 and R2 divide the voltage being monitored (Vd) to an acceptable level and provide isolation of the monitored circuit from the detector circuit. R1 is chosen to be a large enough value so that the detector circuit provides negligible loading to the monitored circuit.

D1 and C1 act as a peak detector which rectify the RF voltage present at the anode terminal of D1 into a DC voltage which is roughly at the peak voltage of the R1/R2 divider, less a diode drop. Use of a low voltage drop diode, such as a Schottky diode, will improve the accuracy of the circuit.

R3 is a bleed resistor to provide a discharge path for C1 and C2 to ground, and is of a large value to lessen the effect of loading.

C2, acting with C1 provides hysteresis to counteract the effect of ripple on the divided voltage (at the junction of R1 and R2) after it first exceeds the trip point set by Vref. Without this hysteresis, this ripple would cause the output of U1 (Vprot) to rapidly toggle between low and high states when the divided voltage is near Vref.

Comparator U1 compares the voltage at it's non-inverting terminal with Vref. The output of U1 (Vprot) is normally low, but goes high during the condition of the non-inverting terminal voltage exceeding Vref.

R4 acts as a load for comparator U1 as well as providing a bleed path for C2. It also ensures that U1 output remains low enough for Q1 to remain in the off condition unless otherwise desired, and provides a bleed path for any electrostatic charges which could otherwise damage Q1.

Q1 does the actual work of shutting off PA stage gate bias when Vprot goes high. The drain terminal will be open during normal operation and essentially shorted to ground when the detection voltage trip point is exceeded. When Vprot goes high, the shunt FET in each shutdown circuit conducts and rapidly discharges the gate bias filter capacitors (C3), thus pinching off the PA devices (Q1 & Q2 in FIG. 2). This drastically reduces PA gain and prevents any further increases in peak Vd.

Q1, R5, R6, and C3 define a "fast attack, slow decay" holdoff circuit that allows for fast turn-off but slower, controlled turn-on of the gate bias when the detector circuit "trips". Fast turn-off is achieved by discharging C3 through Q1. Q1 acts as a low-resistance switch when it is on, resulting in a rapid discharge of C3, which brings the output voltage to close to zero volts quickly. Once Q1 is turned off by U1, the drain of Q1 acts as an open, and the capacitor C3 charges up at a time constant determined by C3, R5, and R6. C3 will ultimately charge to the voltage determined by Vgg and the divider ratio set by R5 and R6. This time constant ensures that the PA stage will not re-enable immediately once Q1 is turned off, but will be delayed until the voltage on C3 charges up to the voltage required to re-enable the PA stage. A typical LDMOS PA stage will not re-enable until this voltage exceeds 3 volts. The holdoff circuit keeps the PA devices inactive until the normal envelope fluctuations in the oscillating Cartesian Feedback loop remove the overdrive condition.

Vcc_1 is the supply voltage for the comparator. Vref and the R1/R2 divider ratio need to be set considering the actual Vcc_1 level, in order to ensure that U1 terminal voltages are always within safe limits.

Vref is the reference voltage. One possible method of obtaining Vref is with a voltage divider off Vcc_1, but a precision voltage reference would be preferred. Vref temperature compensation and tolerancing need to be considered when determining overall circuit accuracy. Temperature compensation can be achieved by inserting a Schottky diode D2 (matched to D1) in series with the grounded leg of the Vref voltage divider with R10, where the value of R10 is about R3/10.

It should be noted that this circuit is required to be fast, in order to protect the PA in a very short period of time, on the order of nanoseconds. Use of a high frequency comparator, Schottky diode, and output FET are necessary. These components should have a switching time period of less than 1/(10BW), where BW is the instantaneous operating bandwidth of the Cartesian feedback linearizer, as shown in FIG. 1. Also, high frequency layout techniques need to be utilized with this circuit, grounding is critical, and judicious usage of bypass capacitors will be required. Bypass caps are not shown in order to simplify the circuitry.

Advantageously, the present invention allows faster response than prior art protection circuits. In addition, the holdoff circuit keeps the PA disabled until the overdrive peak from the oscillating Cartesian feedback linearizer has passed.

The present invention as described herein removes the DC gate bias from one or more cascaded LDMOS PA stages when this peak drain voltage exceeds a level that is higher than peak drain voltage at rated maximum output power, but below the device breakdown voltage. LDMOS devices have a high gate threshold voltage, typically 3-4 volts, so device gain is sharply reduced when the DC gate bias is reduced to zero by this protection circuit. In the event of severe overdrive, it may be necessary to remove gate bias from two or more PA stages, or take some other action to reduce PA drive or PA gain.

This rapid PA shutdown is achieved by using a high speed comparator to drive shunt FETs connected to the gate bias circuit(s). Using a high speed comparator and shunt FETs to remove the gate bias minimizes response time, so that PA shutdown can be achieved before the peak drain voltage (on subsequent RF cycles) can rise to a damaging level.

Detecting the actual peak drain voltage (during each RF cycle) overcomes the correlation problem inherent in prior art PA protection circuits, which use different detection means, such as sensing PA output voltage/power or changes in DC bias levels.

The holdoff circuit is also incorporated, to minimize the likelihood that the PA will be re-activated while to overdrive condition is still present. The holdoff circuit keeps the PA shutdown for a fixed time period. In most cases the normal variation in the drive signal envelope will have removed the overdrive condition by the end of this time period.

During periods of sustained overdrive, the combination of the detector, shutdown and holdoff circuits will form a non-linear feedback loop 204, which can have a much faster response than a linear feedback loop because it is not subject to the same stability constraints.

The nonlinear feedback loop in this invention will only "oscillate" when the PA is subjected to sustained overdrive, and this oscillation is just the normal action of repeating the shutdown cycle at the end of each holdoff period while the overdrive is still present. Typically, any overdrive condition will be terminated after a few seconds, once the transmitter control software detects the overdrive fault and shuts down the entire transmitter. In contrast, an unstable linear feedback loop in the prior art (such as a faulty power control loop) will oscillate at normal drive levels, thus producing unwanted modulation in the PA output at normal operating power levels.

Figure 4:
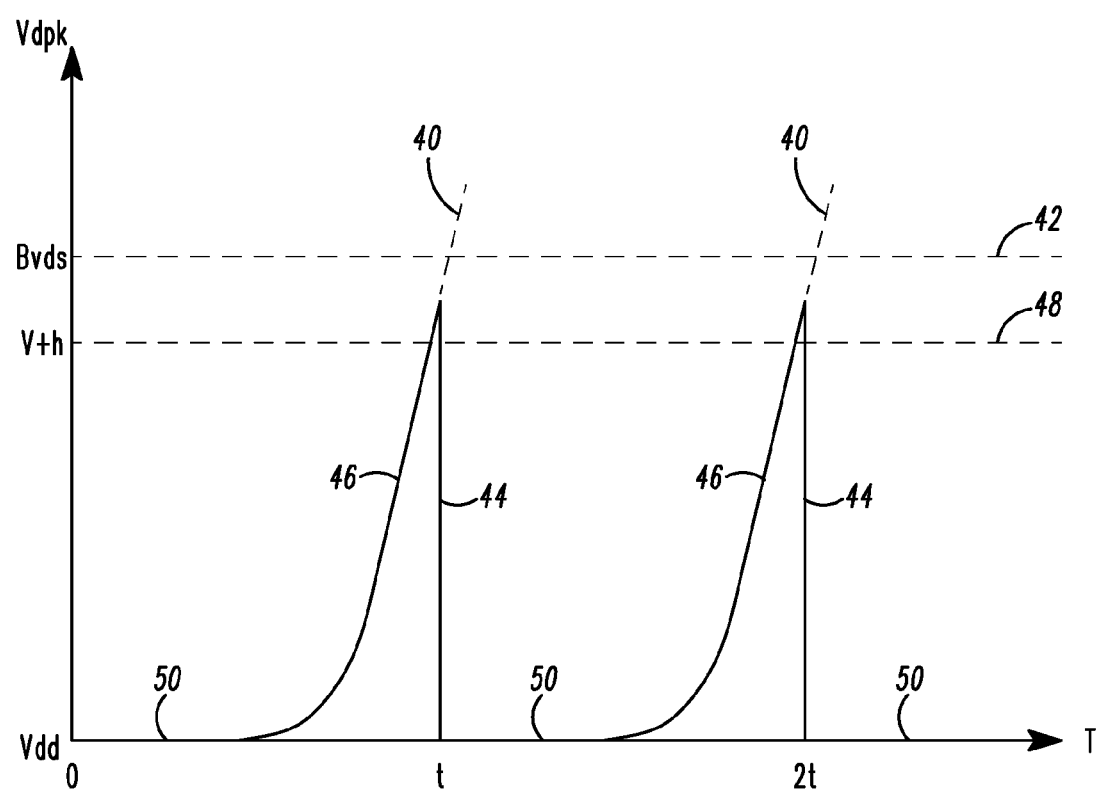
FIG. 4 illustrates a graphical representation of the operation of the detector and shutdown circuit, in accordance with the present invention.

FIG. 4 illustrates the nonlinear feedback loop "oscillation" when the PA is subjected to sustained overdrive. The solid curve 50, 46, 44, represents the peak drain voltage (Vdpk) of the protected PA stage (Q2 in FIG. 2) as a function of time (T). This curve begins with the PA just entering a shutdown state at T=0. At this time, the peak drain voltage (Vdpk) is equal to the DC drain supply voltage (Vdd). During the first part of the holdoff period the gate bias is too low to permit any RF output from the protected PA stage, so Vdpk remains 50 at Vdd. As the gate bias continues to rise back toward its nominal level, the protected PA stage starts producing RF output, so Vdpk begins to rise 46. This rise continues until Vdpk crosses the protection threshold voltage, Vth 48. Very soon thereafter, on the order of 10-100 nanoseconds in the preferred embodiment, Vprot is forced high by the detector circuit, which causes the protection circuit(s) to shut down the gate bias, thus causing Vdpk to immediately drop 44 back to Vdd. If the detector and protection circuits were not present, Vdpk would continue to rise 40 until it exceeded the breakdown voltage BVds 42, at which point the RF power device would be destroyed. The asymmetry between the quick shutdown and slow ramp-up provides the non-linearity in the feedback loop. The present invention avoids exposing the PA power devices to an overvoltage condition 40 by substantially limiting peak drain voltage to a safe level 48 that is less than the breakdown voltage 42 of the power device. Under sustained overdrive, the circuit "oscillates" at the shutdown-recovery cycle, t, until the overdrive is no longer present.

Figure 5:
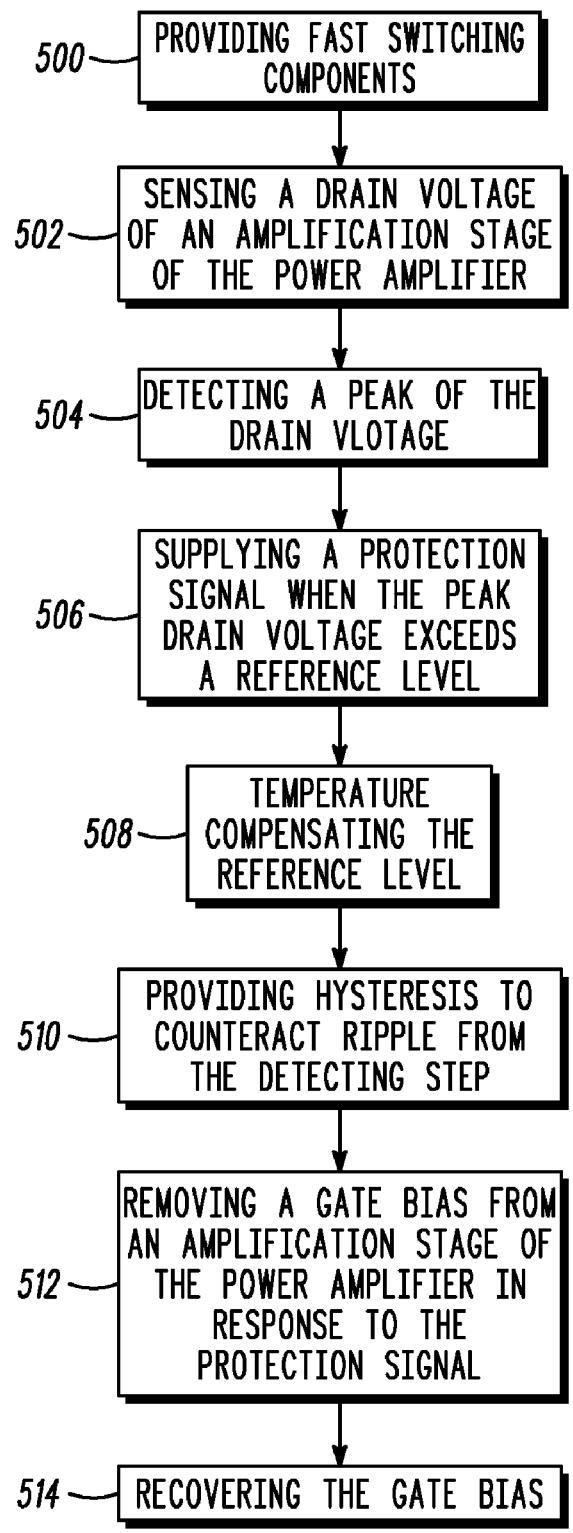
FIG. 5 illustrates a method, in accordance with the present invention.

Referring to FIG. 5, the present invention also provides a method for protecting a radio frequency power amplifier against peak drain voltage. In general, the method of the present invention is served by providing 500 switching components having a switching time period of less than 1/(10BW), where BW is the operating bandwidth of the Cartesian feedback linearizer.

A next step includes sensing 502 a drain voltage of an amplification stage of the power amplifier. This step includes sensing not only the fundamental component of the drain voltage but also the harmonic components of that drain voltage. Preferably, the sensing step is performed on the amplification stage having the highest peak drain voltage.

A next step includes detecting 504 a peak of the drain voltage. The detecting step is applied to at least one amplification stage in the power amplifier and is preferably applied to the last stage.

A next step includes supplying 506 a protection signal when the peak drain voltage exceed a predetermined reference level.

Optionally, a next step includes temperature compensating 508 the predetermined reference level.

Optionally, a next step includes providing 510 hysteresis to counteract ripple from the detecting step 504.

A next step includes removing 512 a gate bias from an amplification stage of the power amplifier in response to the protection signal. The removing step is applied to at least one amplification stage in the power amplifier that coincides with or precedes the amplification stage of the sensing step.

A next step includes recovering 514 the gate bias. Preferably, the removing step 508 is performed faster than the recovery step, which introduces a non-linear feedback loop.

Advantageously, the present invention provides a method and apparatus that protects power amplifiers from excessive operating power levels. The present invention allows the shut down of several PA stages, and can have multiple detection points. This gives this protection circuit the ability to handle the extreme overdrive peaks produced by an oscillating Cartesian feedback linearizer. In addition, the present invention directly detects Vd peaks, as opposed to prior art protection circuits that typically detect output power, or some unusual parameter like base bias current, that has no direct relation to peak Vd. As a result, the present invention allows faster response than prior art protection circuits. In addition, the holdoff circuit keeps the PA disabled until the overdrive peak from oscillating CF linearizer has passed.

The sequences and methods shown and described herein can be carried out in a different order than those described. The particular sequences, functions, and operations depicted in the drawings are merely illustrative of one or more embodiments of the invention, and other implementations will be apparent to those of ordinary skill in the art. The drawings are intended to illustrate various implementations of the invention that can be understood and appropriately carried out by those of ordinary skill in the art. Any arrangement, which is calculated to achieve the same purpose, may be substituted for the specific embodiments shown.

The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term comprising does not exclude the presence of other elements or steps.

Additionally, although individual features may be included in different claims, these may possibly be advantageously combined, and the inclusion in different claims does not imply that a combination of features is not feasible and/or advantageous. Also the inclusion of a feature in one category of claims does not imply a limitation to this category but rather indicates that the feature is equally applicable to other claim categories as appropriate.

Furthermore, the order of features in the claims do not imply any specific order in which the features must be worked and in particular the order of individual steps in a method claim does not imply that the steps must be performed in this order. Rather, the steps may be performed in any suitable order. In addition, singular references do not exclude a plurality. Thus references to "a", "an", "first", "second" etc do not preclude a plurality.

What is claimed is:

1. A radio frequency power amplifier protection circuit for reducing peak drain voltage, comprising:

a detector circuit that includes a comparator, the comparator of the detector circuit having an input connected to a drain of a power transistor of an amplification stage of the power amplifier to detect a drain voltage therefrom and another input connected to a predetermined reference level, the detector circuit supplying a protection signal when a peak drain voltage exceeds the predetermined reference level; and a shutdown circuit, the shutdown circuit coupled to the detector circuit and inputting the protection signal from the detector circuit, the protection signal being used to remove a gate bias of at least one amplification stage of the power amplifier.

2. The circuit of claim 1, wherein the detector circuit is operable to detect high voltage harmonic resonances in the drain voltage of the power amplifier.

3. The circuit of claim 1, wherein the detector circuit includes a Schottky diode peak detector circuit.

4. The circuit of claim 1, wherein the shutdown circuit includes a FET, and wherein the comparator and FET have switching time period of less than 1/(10BW), where BW is the instantaneous operating bandwidth of the power amplifier.

5. The circuit of claim 1, wherein the shutdown circuit includes a holdoff circuit operable to allow a removal of gate bias that is faster than a recovery of gate bias, wherein the detector circuit, shutdown circuit, and holdoff circuit define a non-linear feedback loop for the power amplifier.

6. The circuit of claim 1, wherein the detector circuit includes a hysteresis circuit to prevent detector ripple from switching the protection signal.

7. The circuit of claim 1, wherein the gate bias is applied to at least one amplification stage in the power amplifier that precedes the amplification stage where the drain voltage is detected.

8. The circuit of claim 1, wherein the reference level is provided with temperature compensation.

9. The circuit of claim 1, where the detector circuit is connected to the amplification stage having the highest peak drain voltage.

10. A Cartesian feedback linearized radio frequency power amplifier with at least one amplification stage and including a protection circuit for reducing peak drain voltage, the amplifier comprising:

a detector circuit operable to detect high voltage harmonic resonances in the drain voltage of the power amplifier, the detector circuit having an input connected to a drain of a power transistor of an amplification stage of the power amplifier to detect a peak drain voltage therefrom, the detector circuit includes a Schottky diode peak detector circuit coupled to a comparator to compare the peak drain voltage against a predetermined reference level, the comparator outputting a protection signal when the detected peak drain voltage exceed the predetermined reference level;

a shutdown circuit, the shutdown circuit coupled to the detector circuit and inputting the protection signal from the detector circuit, the protection signal being used to remove a gate bias of at least one amplification stage of the power amplifier; and a holdoff circuit operable to allow a removal of gate bias that is faster than a recovery of gate bias, wherein the detector circuit, shutdown circuit, and holdoff circuit define a non-linear feedback loop for the power amplifier.

11. The power amplifier of claim 10, wherein the shutdown circuit includes a FET, and wherein the comparator and FET have switching time period of less than $1/(10BW)$, where BW is the operating bandwidth of the Cartesian feedback linearizer.

12. The power amplifier of claim 10, wherein the gate bias is applied to at least one amplification stage in the power amplifier that precedes the amplification stage where the drain voltage is detected.

13. A method for protecting a radio frequency power amplifier against peak drain voltage, the method comprising the steps of:

sensing a drain voltage of an amplification stage of the power amplifier;

detecting a peak of the drain voltage;

comparing the peak of the drain voltage to a predetermined reference level;

supplying a protection signal when the peak drain voltage exceeds the predetermined reference level;

removing a gate bias from an amplification stage of the power amplifier in response to the protection signal.

14. The method of claim 13, wherein the sensing step includes sensing high voltage harmonic resonances in the drain voltage of the power amplifier.

15. The method of claim 13, further comprising a step of recovering the gate bias, wherein the removing step is performed faster than the recovery step.

16. The method of claim 13, further comprising a step of providing hysteresis to counteract ripple from the detecting step.

17. The method of claim 13, wherein the removing step is applied to at least one amplification stage in the power amplifier that precedes the amplification stage of the sensing step.

18. The method of claim 13, further comprising the step of temperature compensating the reference level.

19. The method of claim 13, wherein the sensing step is performed on the amplification stage having the highest peak drain voltage.

20. The method of claim 13, further comprising the step of providing switching components for the removing step, wherein the switching components have a switching time period of less than $1/(10BW)$, where BW is the instantaneous operating bandwidth of the power amplifier.

* * * * *